(12) United States Patent
Liu

(10) Patent No.: US 12,727,089 B2
(45) Date of Patent: Sep. 1, 2026

(54) DISPENSER AND LIFTING DEVICE OF DISPENSER

(71) Applicant: Illinois Tool Works Inc., Glenview, IL (US)

(72) Inventor: Guohua Liu, Jiangsu (CN)

(73) Assignee: Illinois Tool Works Inc., Glenview, IL (US)

( * ) Notice: Subject to any disclaimer, the term of this patent is extended or adjusted under 35 U.S.C. 154(b) by 57 days.

(21) Appl. No.: 18/858,954

(22) PCT Filed: Jun. 5, 2023

(86) PCT No.: PCT/US2023/024403
§ 371 (c)(1),
(2) Date: Oct. 22, 2024

(87) PCT Pub. No.: WO2023/244456
PCT Pub. Date: Dec. 21, 2023

(65) Prior Publication Data

US 2025/0287507 A1 Sep. 11, 2025

(30) Foreign Application Priority Data

Jun. 15, 2022 (CN) ......................... 202210679077.0

(51) Int. Cl.
*H05K 3/00* (2006.01)
*B05C 5/02* (2006.01)
*B05C 21/00* (2006.01)

(52) U.S. Cl.
CPC ............. *H05K 3/0091* (2013.01); *B05C 5/02* (2013.01); *B05C 21/00* (2013.01); *H05K 2203/0126* (2013.01)

(58) Field of Classification Search
CPC .......... H05K 3/0091; H05K 2203/0126; B05C 5/02; B05C 21/00
(Continued)

(56) References Cited

U.S. PATENT DOCUMENTS

2021/0213480 A1* 7/2021 Wajiki ...................... B05C 5/02
2022/0206392 A1* 6/2022 Noh .......................... G03F 7/16
(Continued)

FOREIGN PATENT DOCUMENTS

CN 211563540 U * 9/2020
CN 112221898 A * 1/2021 ............. B05C 13/00
JP 2005123636 A * 5/2005

OTHER PUBLICATIONS

Machine translation of CN-112221898-A.*
(Continued)

*Primary Examiner* — Jeremy Carroll
(74) *Attorney, Agent, or Firm* — Lando & Anastasi, LLP

(57) ABSTRACT

The present disclosure provides a dispenser for dispensing a material on a substrate. The dispenser includes a pair of rails, a heating device, and a pair of lifting devices. One of the pair of rails is able to move towards or away from the other in the Y-axis direction to adjust the distance between the pair of rails, each rail having a supporting surface and a blocking portion above the supporting surface for supporting the substrate in a transport position, the blocking portion being used to keep the substrate in a dispensing position. The heating device is located below the pair of rails in the Z-axis direction and is movable in the Z-axis direction. The pair of lifting devices are respectively mounted on the pair of rails, each including: a lifting member movably connected to the rail and a reset member between the rail and the lifting member. The lifting member is able to be raised under pushing of the heating device to cause the substrate to rise from the transport position to the dispensing position and to lower the substrate from the dispensing position to the transport position under the action of the reset member when the heating device descends.

10 Claims, 6 Drawing Sheets

(58) Field of Classification Search
USPC ........................................................ 222/146.5
See application file for complete search history.

(56) References Cited

U.S. PATENT DOCUMENTS

2023/0126512 A1* 4/2023 Liu .......................... B08B 5/023 15/306.1
2024/0416383 A1* 12/2024 Jang .................... B05C 11/1047

OTHER PUBLICATIONS

Machine Translation of CN-211563540-U.*
Machine Translation of JP-2005123636-A.*
International Search Report for PCT Application No. PCT/US2023/024403 mailed Sep. 19, 2023.

* cited by examiner

DISPENSER AND LIFTING DEVICE OF DISPENSER

CROSS REFERENCE TO RELATED APPLICATIONS

This application is a U.S. National Phase Application under 35 U.S.C. § 371 of International Application No. PCT/US2023/024403, filed Jun. 5, 2023, which claims priority to Chinese National application No. 2022106790770, filed on Jun. 15, 2022, the entire contents of each of which is hereby incorporated by reference.

TECHNICAL FIELD

The present disclosure generally relates to a device for dispensing a viscous material on a substrate (such as a printed circuit board).

BACKGROUND ART

During manufacturing of printed circuit boards, in some cases, there is a need to dispense a viscous material (e.g., an viscous) on the circuit boards for better connecting some circuit elements to the circuit boards. A dispenser for dispensing the viscous material on the printed circuit board is also referred to as a dispenser. In such a dispenser, there is a transport rail for transporting the substrate, a dispensing unit located above the rail, and a heating device located below the rail. The heating device is used to heat the substrate during dispensing operations by the dispensing unit so that the viscous material is better attached to the desired position of the substrate.

SUMMARY OF THE INVENTION

According to a first aspect of the present disclosure, there is provided a dispenser for dispensing a material on a substrate. The dispenser includes: a pair of rails configured to input and output the substrate to the dispenser in an X-axis direction, where one of the pair of rails is movable in a Y-axis direction towards or away from the other to adjust a distance between the pair of rails, a supporting surface and a blocking portion higher than the supporting surface are disposed on each of the pairs of rails, the supporting surface of the pair of rails is configured to support the substrate in a transport position, and the blocking portion of the pair of rails is configured to keep the substrate in a dispensing position; a heating device located below the pair of rails in a Z-axis direction and movable in the Z-axis direction; and a pair of lifting devices mounted to the pair of rails respectively, each of the pair of lifting devices including: a lifting member movably connected to the rail and movable in the Z-axis direction; and a reset member located between the rail and the lifting member to be compressed when the lifting member is raised relative to the rail and to be able to lower the lifting member relative to the rail by a resilient force; where the lifting member is configured to be able to be raised under pushing of the heating device to cause the substrate to rise from the transport position to the dispensing position, and to lower the substrate to the transport position from the dispensing position under an action of the reset member when the heating device descends.

According to the dispenser described above, the lifting device further includes a connecting device including a connecting slot disposed on the lifting member and a connecting member connected to the rail, the connecting slot extending along the Z-axis direction, the connecting member being inserted into the connecting slot and being movable in the connecting slot in the Z-axis direction.

According to the dispenser described above, the lifting member is a clevis-like and sleeved on the rail from the underside of the rail, the lifting member including a pair of side plates and a base plate connected between the pair of side plates, the pair of side plates being respectively located on opposite sides of the rail, the base plate being located below the rail, where the pair of side plates each has at least one connecting slot.

According to the dispenser described above, the lifting member extends by a distance along the X-axis direction. The lifting device includes several reset members, several connecting slots disposed on each of the side plates, and several connecting members corresponding to the several connecting slots, where the several reset members are arranged in the X-axis direction, and the several connecting slots are arranged in the X-axis direction.

According to the dispenser described above, a hole is provided in the rail, and the reset member is at least partially located in the hole.

According to the dispenser described above, the reset member is a helical spring.

According to the dispenser described above, the dispenser also includes a guide pin, a bottom end of the guide pin is connected to the lifting member, and the reset member is sleeved on the guide pin.

According to the dispenser described above, the lifting device further includes a guide wheel having a slit on an exterior surface thereof, the slit extending circumferentially along the guide wheel. The guide wheel is sleeved on the connecting member, the guide wheel is inserted into the connecting slot, and opposite edges of the side plate of the lifting member forming the connecting slot are clamped in the slit of the guide wheel.

According to the dispenser described above, the blocking portion is formed by a baffle mounted at a top end of the rail.

According to the dispenser described above, the dispenser further includes a drive device disposed below the heating device for driving movement of the heating device in the Z-axis direction.

DESCRIPTION OF EMBODIMENTS

Various specific embodiments of the present disclosure will be described below with reference to the appended drawings that form a part of the present specification. It should be understood that while terms denoting orientation, such as “front”, “rear”, “upper”, “lower”, “left”, “right”, “top”, “bottom”, etc., are used in the present disclosure to describe various exemplary structural parts and elements of the present disclosure, these terms are used herein for convenience of illustration only and are determined based on the exemplary orientations shown in the appended drawings. Since the examples disclosed in the present disclosure may be disposed in different orientations, these terms denoting orientation are for illustrative purposes only and should not be considered as limiting.

Figure 1:
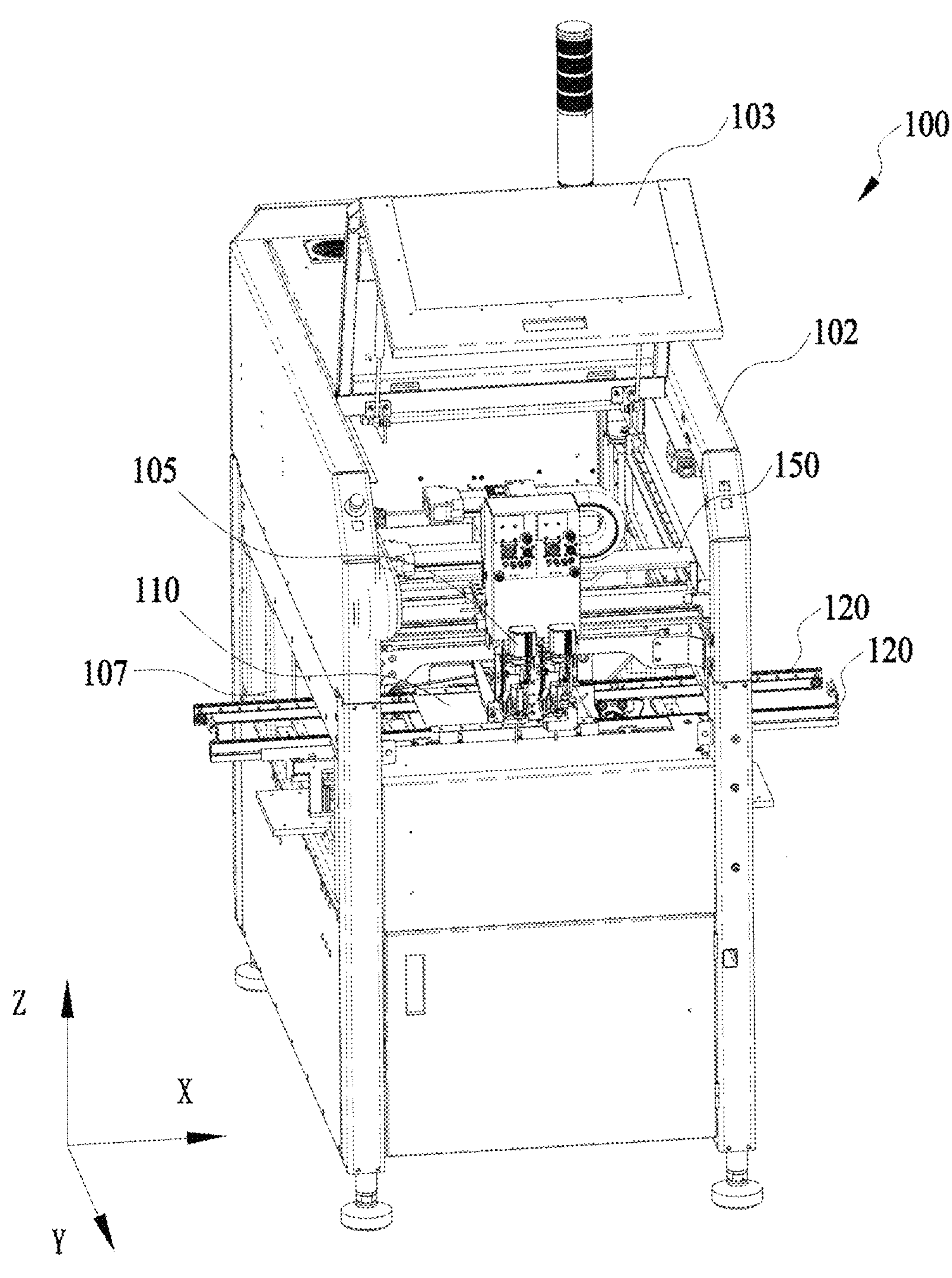
FIG. 1 is a stereoscopic view of a dispenser according to an example of the present disclosure.

FIG. 1 is a stereoscopic view of a dispenser 100 according to an example of the present disclosure. As shown in FIG. 1, the dispenser 100 includes a body frame 102 that is box-like with a width extending in the X-axis direction, a length extending in the Y-axis direction, and a height extending in the Z-axis direction. The body frame 102 has a housing space for supporting and housing various components of the dispenser 100. The dispenser 100 also includes a front cover 103 disposed on the body frame 102 for opening and closing the housing space of the body frame 102. The body frame 102 includes an opening 107 that run through itself in the X-axis direction. The dispenser 100 includes a pair of rails 120 that extend into the body frame 102 via the opening 107 for inputting and outputting a substrate 110 (e.g., a printed circuit board) into or out of the dispenser 100 for dispensing a viscous material (e.g., a binder) onto the substrate 110. The dispenser 100 also includes a dispensing unit 105 disposed above the rail 120 and a rack 150 for the dispensing unit 105. The dispensing unit 105 is, for example, a dispensing head, which is capable of dispensing a viscous material onto the substrate 110. The quantity of dispensing units 105 may be set as desired, and two dispensing units are side by side in the X-axis direction in the example shown in FIG. 1. The rack 150 is used to move the dispensing unit 105 in the Y-axis direction and the X-axis direction to move the dispensing unit 105 over the position to be dispensed of the substrate 110. The dispenser 120 also includes a heating device 201 disposed below the rail 120 for heating the substrate 110 prior to the dispensing unit 105 performing a dispensing operation, so as to better adhere the dispensed viscous material onto the substrate 110.

In the dispenser 100 according to the present disclosure, the dispensing unit 105 is able to move in the Y-axis and X-axis directions parallel to the rail 120 to move to a desired dispensing position on the alignment substrate 110 prior to performing the dispensing operation, but the dispensing unit 105 does not move in the Z-axis direction perpendicular to the rail to move near the dispensing position on the substrate, but rather drives the substrate 110 up through the lifting heating device 201 to cause the substrate 110 to be proximate to the dispensing unit 105. Therefore, the dispenser 100 of the present disclosure also includes a drive device 203 for driving movement of the heating device 201 in the Z-axis direction (as shown in FIG. 2) and a pair of lifting devices 250 (as shown in FIG. 2) mounted respectively on the pair of rails 120.

Figure 2:
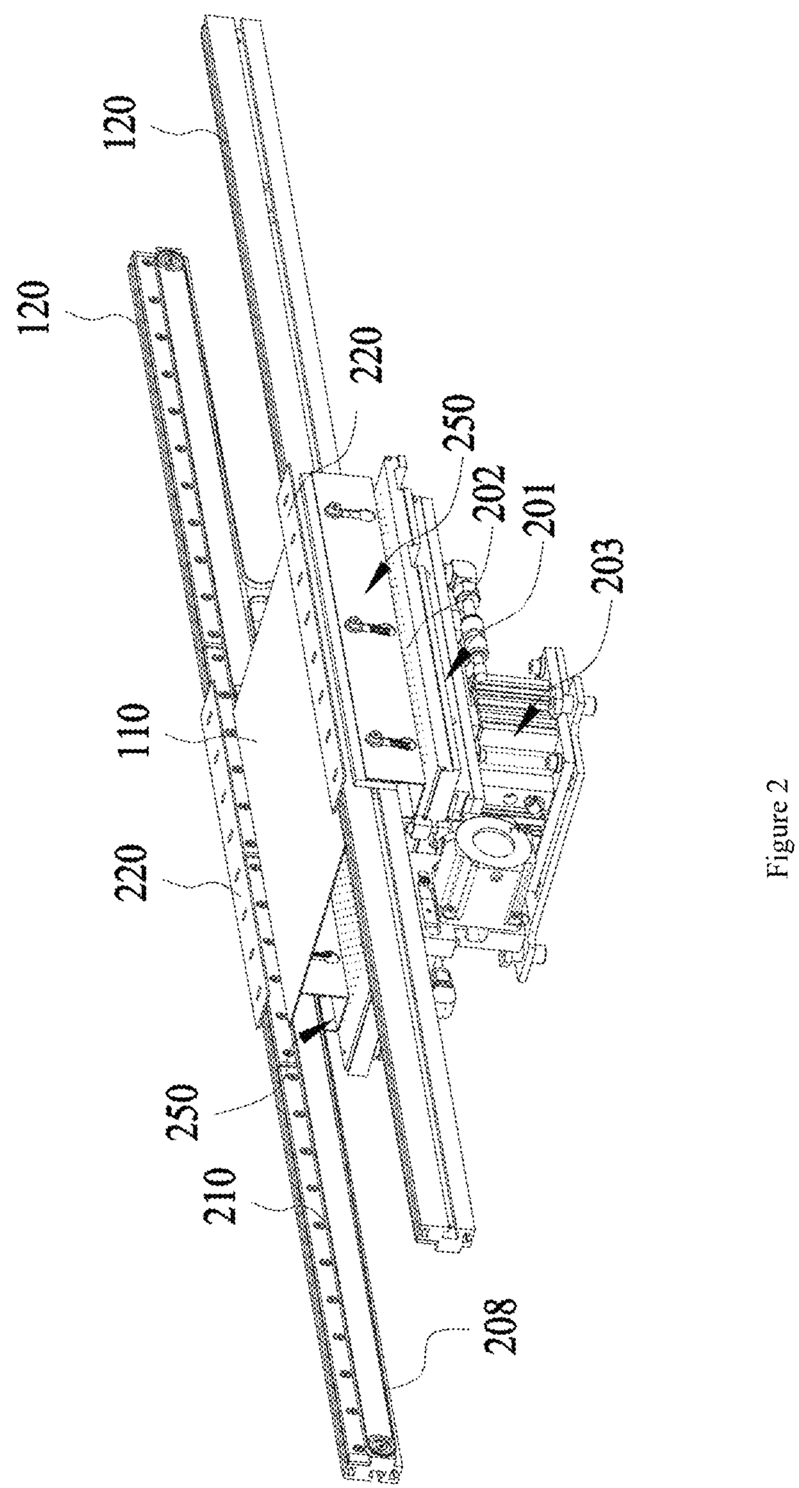
FIG. 2 is a stereoscopic view of a rail, a lifting device, a heating device, and a drive device of FIG. 1.

FIG. 2 is a stereoscopic view of the rail 120, the lifting device 250, the heating device 201, and the drive device 203 of FIG. 1. As shown in FIG. 2, the pair of rails 120 are disposed in parallel with each other and extend in the X-axis direction. One of the rails is a fixed rail and the other is a movable rail, which is movable in the Y-axis direction. Accordingly, the distance between the pair of rails 120 may be adjusted to accommodate different substrate widths. Each rail 120 is provided with a transport belt 208, such as an annular belt, for transporting the substrate 110 to move along the X-axis direction. The transport belt 208 is disposed on a side of the pair of rails 120 facing each other. The transport belt 208 forms a supporting surface 210 extending in the X-axis direction, and supporting surfaces 210 on the pair of rails 120 collectively support the substrate 110. Each rail 120 also includes a blocking portion 220 located above the supporting surface 210, and the blocking portion 220 is formed by a baffle disposed at the top of the rail 120. When the substrate 110 is located on the supporting surface 210 of the pair of rails 120, the substrate 110 is located in its transport position where the substrate 110 can be transported in the X-axis direction. When the substrate 110 is raised along the Z-axis direction to contact the blocking portion 220, the substrate 110 is located in its dispensing position where the substrate 110 is proximate the dispensing unit 105, where the dispensing unit 105 is capable of dispensing a viscous material in a desired position on the substrate 110.

Still as shown in FIG. 2, the heating device 201 is located below the rail 120 and the drive device 203 is located below the heating device 201. The heating device 201 is used to heat the substrate 110, and the drive device 203 drives the heating device 201 to rise and fall along the Z-axis direction to enable the heating device 201 to be proximate or remote from the substrate 110. The heating device 201 includes a wind deflector 202 located at the top thereof, and the wind deflector 202 has uniformly distributed air guide holes for directing hot air to blow evenly towards the substrate 110. The drive device 203 is, for example, an air cylinder. Each rail 120 is mounted with one lifting device 250 located below the substrate 110 so as to be able to push the substrate 110 to rise. The lifting device 250 is capable of lifting the substrate 110 from the transport position to the dispensing position under pushing of the heating device 201 and is capable of causing the substrate to fall from the dispensing position to the transport position when the heating device 201 is descends.

Figure 3A:
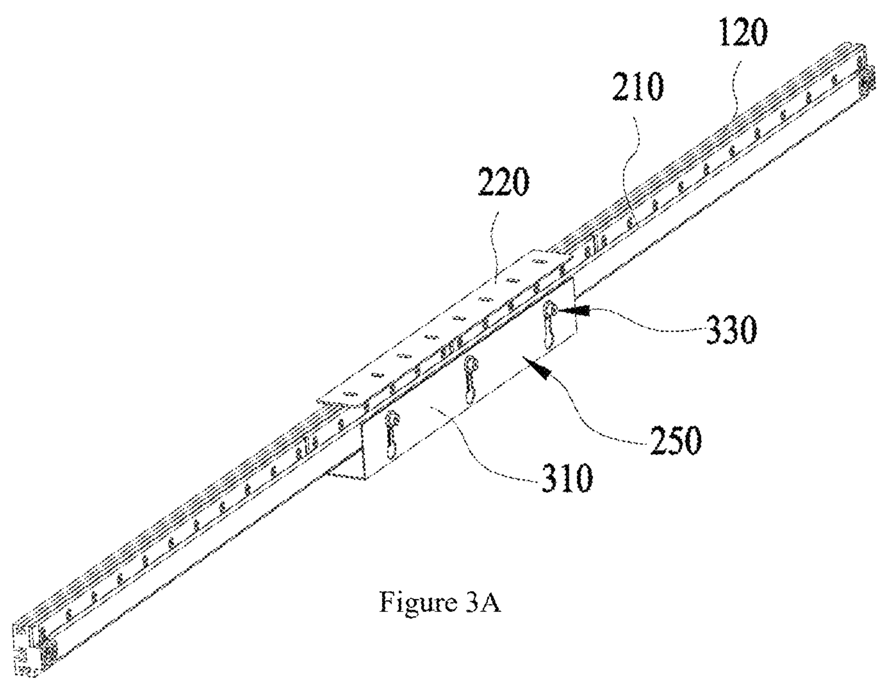
FIG. 3A is a stereoscopic view of the rail and the lifting device of FIG. 2.
Figure 3B:
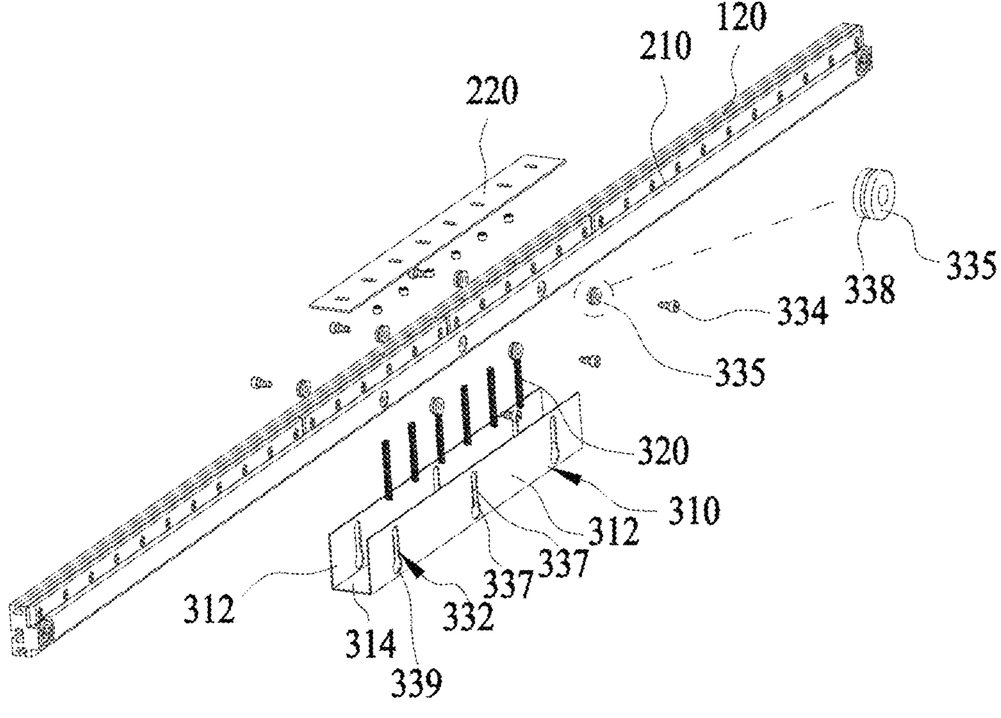
FIG. 3B is an exploded view of the rail and the lifting device of FIG. 2.
Figure 3C:
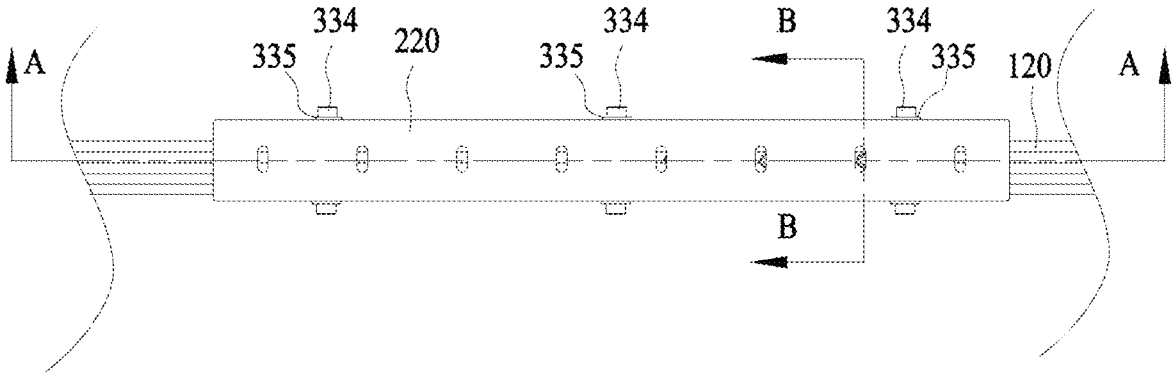
FIG. 3C is a partial enlarged view of a top view of the rail and the lifting device of FIG. 2.
Figure 3D:
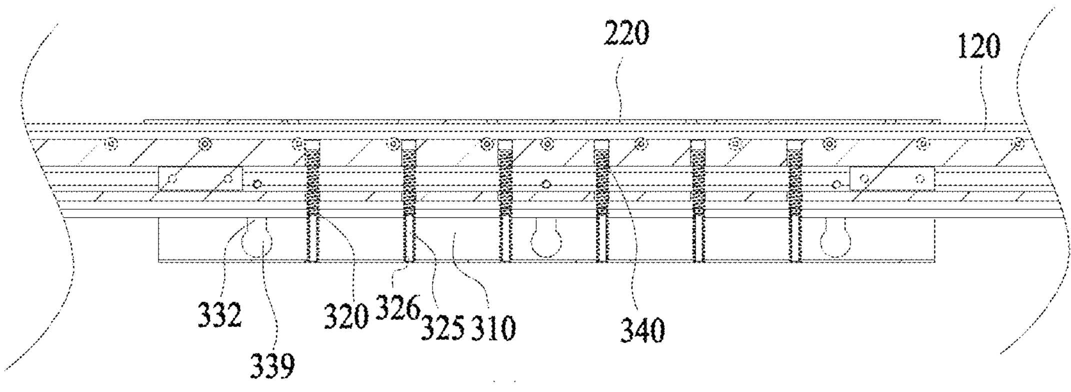
FIG. 3D is a cross-sectional view along line A-A in FIG. 3C.
Figure 3E:
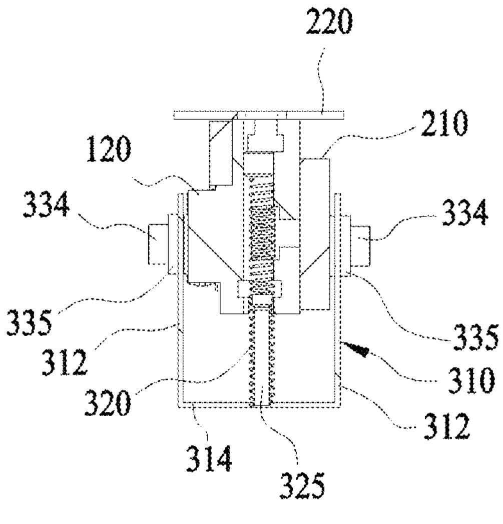
FIG. 3E is a cross-sectional view along line B-B in FIG. 3C.

FIGS. 3A-3E show a specific structure of the lifting device 250, where FIG. 3A is a stereoscopic view of the rail 120 and the lifting device 250, FIG. 3B is an exploded view of the rail 120 and the lifting device 250, and FIG. 3C is a partial enlarged view of a top view of the rail 120 and the lifting device 250, FIG. 3D is a cross-sectional view along line A-A in FIG. 3C, and FIG. 3E is a cross-sectional view along line B-B in FIG. 3C. As shown in FIGS. 3A-3E, the lifting device 250 includes a lifting member 310, a reset member 320, and a connecting device 330, and the lifting member 310 is movably connected to the rail 120 by the connecting device 330 and is movable in the Z-axis direction. The reset member 320 is disposed between the lifting member 310 and the rail 120 to be compressed as the lifting member 310 rises relative to the rail 120 and to be able to lower the lifting member 310 relative to the rail 120 by a resilient force. The lifting member 310 is located below the substrate 110, and is capable of moving the substrate 110 from the transport position to the dispensing position when it is raised, and moving the substrate 110 from the dispensing position to the transport position when it descends. The connecting device 330 includes a connecting slot 332 disposed on the lifting member 310 and a connecting member 334 connected to the rail 120, and the connecting member 334 is, for example, a bolt.

The lifting member 310 is clevis-like and extends by a distance along an extension direction of the rail 120 (i.e., in the X-axis direction). The lifting member 310 includes a pair of side plates 312 and a base plate 314 connected between the pair of side plates 312. Together, the pair of side plates

312 and the base plate 314 form the clevis-like lifting member 310 that enables the lifting member 310 to be sleeved on the rail 120 from below the rail 120, such that the pair of side plates 314 are located on opposite sides of the rail 120, while the base plate 314 is located below the rail 120. The pair of side plates 312 of the lifting member 310 each have several connecting slots 332 on each side plate 312, the several connecting slots 332 are arranged along the extension direction (i.e., the X-axis direction) of the lifting member 310, and each connecting slot 332 extends along the Z-axis direction, and thus has a length to allow movement of the lifting member 310 along the Z-axis direction.

The lifting device 250 also includes several guide wheels 335, and the quantity of guide wheels 335 is corresponding to the quantity of connecting slots 332. The guide wheel 335 is sleeved on the connecting member 334 which is secured to the rail 120, and both the guide wheel 335 and the connecting member 334 are inserted into the connecting slot 332. The guide wheel 335 is configured to cooperate with the connecting slot 332 to guide the lifting member 310 to move smoothly in the Z-axis direction. The outer surface of the guide wheel 335 is set as a slit 338 that extends circumferentially along the guide wheel 335, and the width of the slit 338 is slightly greater than the thickness of the side plate 314 of the lifting member 310, so that a pair of opposite edges 337 of the side plate 314 forming the connecting slot 332 are clamped in the slit 338 of the guide wheel 335.

As shown in FIGS. 3B and 3D, the side plate 314 is provided with an opening 339 that is enlarged in size compared to the width of the connecting slot 332 at the bottom end of the connecting slot 332, the opening 339 is in communication with the connecting slot 332, and the opening 339 is sized to be larger than the outer diameter of the guide wheel 335, so that the guide wheel 335 can be inserted into the connecting slot 332 via the opening 339, and after moving upward, be clamped by its slit 338 to form a pair of edges 337 of the slit 338. As such, the guide wheel 335 is capable of directing the lifting member 310 to move smoothly in the Z-axis direction.

In some examples, the reset member 320 is a helical spring. There may be a plurality of reset members 320, which are arranged along the extension direction (i.e., the X-axis direction) of the lifting member 310. The reset member 320 is disposed in a hole of the rail 120 with the bottom end of the rail 120 extending through the hole of the rail 120 to abut against the bottom plate 314 of the lifting member 310, and with the top end thereof connected to the rail.

The lifting device 250 also includes a guide pin 325, and the quantity of guide pins 325 is the same as the quantity of reset members 320. A bottom end 326 of the guide pin 325 is connected to the bottom plate 314 of the lifting member 310, and the guide pin 325 is located between the pair of side plates 312. The guide pin 325 extends generally along the Z-axis direction, and the reset member 320 is sleeved on the guide pin 325 such that the reset member 320 can be compressed or released along the Z-axis direction.

As the lifting member 310 rises along the Z-axis relative to the rail 120, the reset member 320 is compressed by the lifting member 310 to accumulate a resilient force. The lifting member 310 can also descend along the Z-axis relative to the rail 120 under the action of the resilient force of the reset member 320.

Figure 4A:
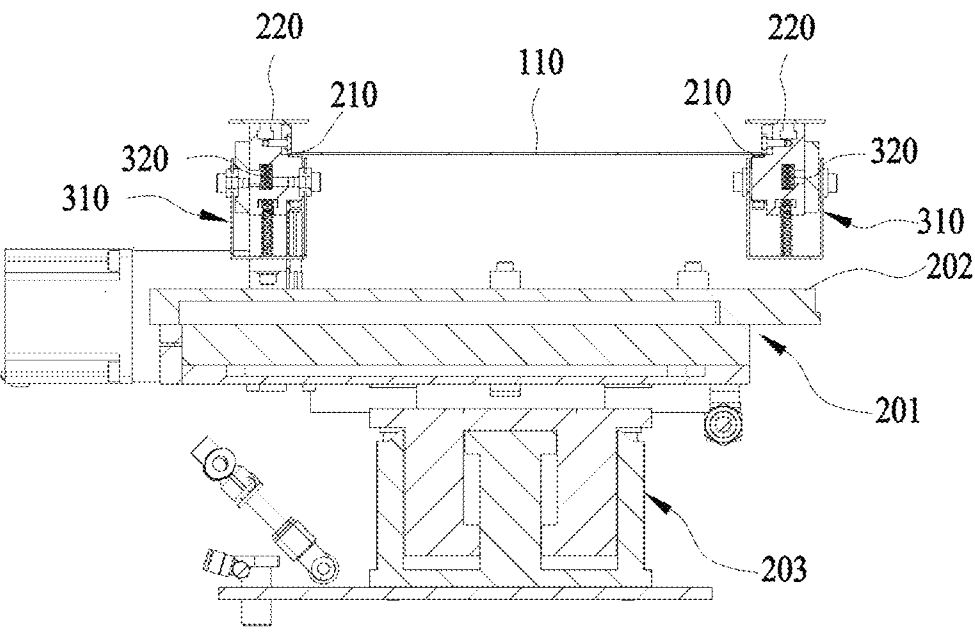
FIG. 4A is a cross-sectional view of a substrate of FIG. 2 in a transport position.
Figure 4B:
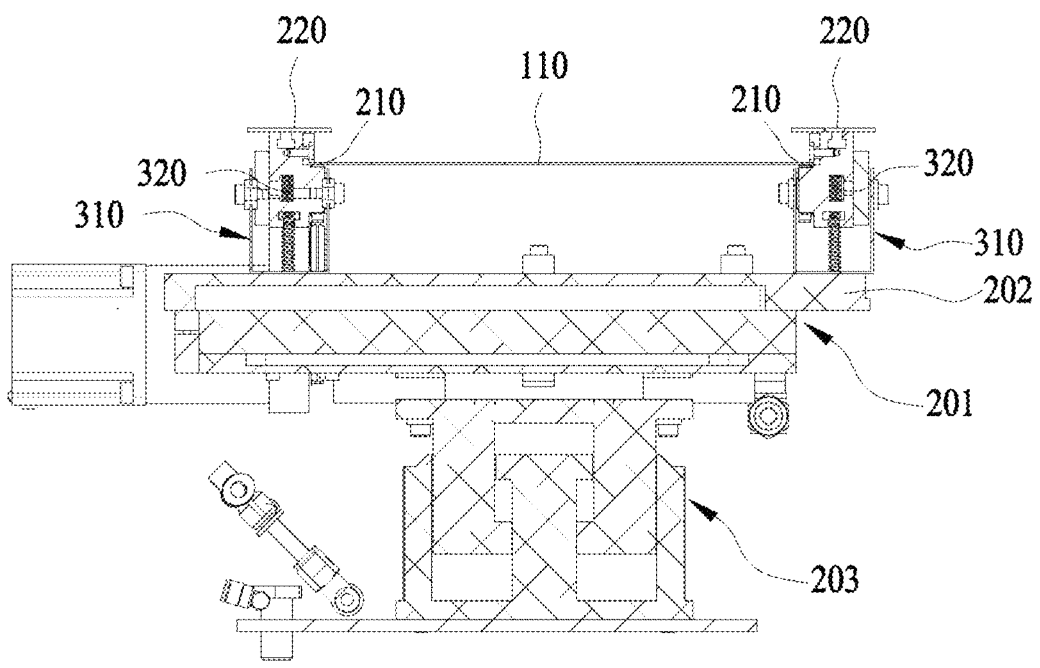
FIG. 4B is a cross-sectional view of the heating device of FIG. 2 when raised to contact the lifting device.
Figure 4C:
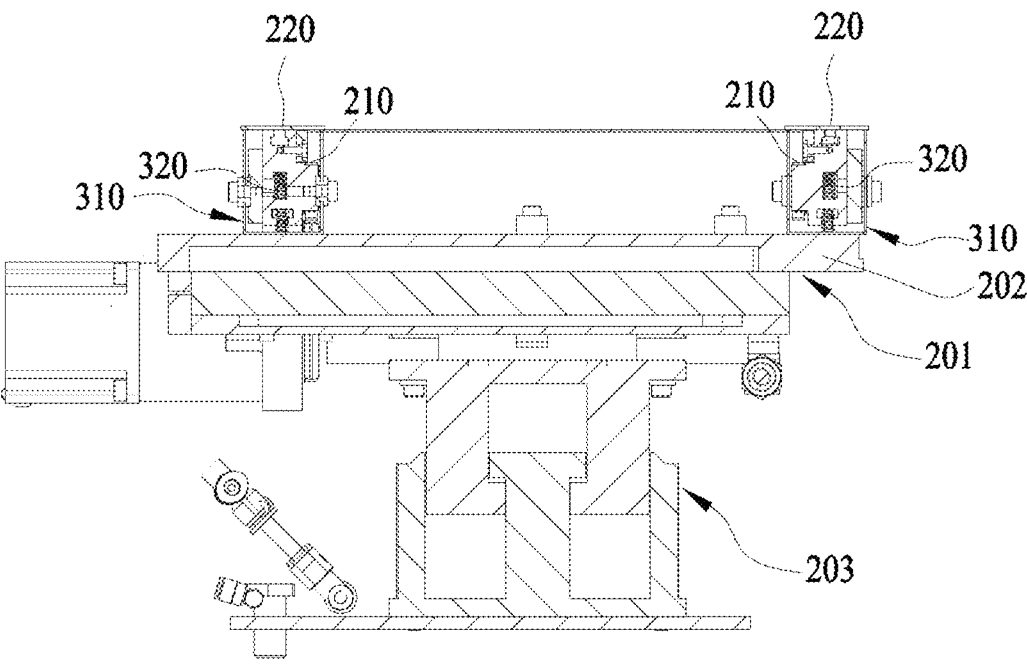
FIG. 4C is a cross-sectional view of the substrate of FIG. 2 when raised to a dispensing position.

FIGS. 4A-4C show a status change of the lifting device 250 of the dispenser 100 as the substrate 110 moves between the transport position and the dispensing position. FIG. 4A is a cross-sectional view of the substrate 110 in the transport position in FIG. 2, FIG. 4B is a cross-sectional view of the heating device 201 when raised to contact the lifting device 250, and FIG. 4C is a cross-sectional view of the substrate 110 when raised to the dispensing position.

As shown in FIG. 4A, when the substrate 110 is in the transport position, the substrate 110 is supported by a supporting surface 210 of the pair of rails 120, and the lifting member 310 of the lifting device 250 does not contact, but rather is spaced apart from, the wind deflector 202 of the heating device 201. When there is a need to dispense a viscous material onto the substrate 110, the heating device 201 is driven upward by the drive device 203 so as to bring the heating device 210 into proximity to the substrate 110 to perform a heating operation on the substrate 110, while also being able to move the substrate 110 to the dispensing position through the heating device 210.

As shown in FIG. 4B, the heating device 201 is driven by the drive device 203 to raise such that its wind deflector 202 is in contact with the lifting member 310 of the lifting device 250. Thereafter, the drive device 203 continues to drive the heating device 201 to move axially along the Z-axis, and movement of the heating device 201 will cause the lifting member 310 of the lifting device 250 to rise relative to the rail 120. As the lifting member 310 is located below the substrate 110, the lifting member 310 will contact and push the substrate 110 to rise until it reaches the position shown in FIG. 4C.

As shown in FIG. 4C, when the substrate 110 rises to abut against the blocking portion 220, the substrate 110 is blocked from continuing to rise and the substrate 110 reaches its dispensing position. During movement from the state shown in FIG. 4B to the state shown in FIG. 4C, the movement of the lifting member 310 relative to the rail 120 compresses the reset member 320.

When the dispensing operation for the substrate 110 is complete, the drive device 203 drives the heating device 201 to descend along the Z-axis, and the lifting member 310 is able to descend along the Z-axis under the resilient force of the reset member 320 as it is no longer pushed by the heating device 201, causing the substrate 110 to also descend until the substrate 110 is supported by the supporting surface 210 of the rail 120 to reach its transport position.

The dispenser 100 usually needs to be designed to process substrates 110 with different widths. In order to move the substrate 110 between the transport position and the dispensing position, the distance between the lifting devices 250 needs to adapt to the width of the substrate 110 so that the lifting device 250 can push the substrate 110 to lift or descend, and the distance between the pair of rails 120 need to adapt to the width of the substrate 110 so as to support the substrate 110. As the contributor 100 of the present disclosure is provided with lifting devices 250 mounted on the pair of rails 120 respectively, the lifting devices 250 can be pushed by the heating device 201 and further push the substrate 110 to move, so that the substrate 110 can move from its transport position to the contribution position to perform the contribution operation. When the distance between the pair of rails 120 needs to be adjusted according to the width of the substrate 110, the distance between the lifting devices 250 mounted on the pair of rails 120 is also adjusted accordingly, so that the distance between the lifting devices 250 also adapts to the width of the substrate 110. As such, the same lifting device 110 and heating device 201 can adapt to different substrate widths.

In addition, as the lifting device 250 of the present disclosure surrounds the rail 120 by using the lifting member 310, when the heating device 201 contacts the lifting member 310 to push the lifting member upward and perform a heating operation on the substrate 110, the lifting member 310 can isolate the rail 120 from the heating device 210 to protect the rail 120 (especially the transport belt 208 on the rail 120) from high temperature baking from the heating device 210.

Although the present disclosure has been described in connection with examples outlined above, various alternatives, modifications, variations, improvements, and/or substantial equivalents, whether known or foreseeable now or in the near future, may be apparent to those having at least ordinary skill in the art. In addition, the technical effects and/or technical problems described in the present specification are exemplary and not limiting; therefore, the disclosure in the present specification may be used to solve other technical problems and have other technical effects and/or may solve other technical problems. Therefore, examples of the present disclosure as set forth above are intended to be illustrative and not limiting. Various changes may be made without departing from the spirit or scope of the present disclosure. Therefore, the present disclosure is intended to include all known or earlier developed alternatives, modifications, variations, improvements and/or substantial equivalents.

What is claimed is:

1. A dispenser (100) configured to dispense a material on a substrate (110), wherein the dispenser (100) comprises:

a pair of rails (120) configured to input and output the substrate (110) to the dispenser (100) in an X-axis direction, wherein one of the pair of rails (120) is movable in a Y-axis direction towards or away from the other to adjust a distance between the pair of rails (120), a supporting surface (210) and a blocking portion (220) higher than the supporting surface (210) are disposed on each of the pairs of rails (120), the supporting surface (210) of the pair of rails (120) is configured to support the substrate (110) in a transport position, and the blocking portion (220) of the pair of rails (120) is configured to keep the substrate (110) in a dispensing position;

a heating device (201) located below the pair of rails (120) in a Z-axis direction and movable in the Z-axis direction; and a pair of lifting devices (250) mounted to the pair of rails (120) respectively, each of the pair of lifting devices (250) comprising:

a lifting member (310) movably connected to the rail (120) and movable in the Z-axis direction; and a reset member (320) located between the rail (120) and the lifting member (310) to be compressed when the lifting member (310) is raised relative to the rail (120) and to be able to lower the lifting member (310) relative to the rail (120) by a resilient force;

wherein the lifting member (310) is configured to be able to be raised under pushing of the heating device (201) to cause the substrate (110) to rise from the transport position to the dispensing position, and to lower the substrate (110) to the transport position from the dispensing position under an action of the reset member (320) when the heating device (201) descends.

2. The dispenser (100) according to claim 1, wherein:

the lifting device (250) further comprises a connecting device (330) comprising a connecting slot (332) disposed on the lifting member (310) and a connecting member (334) connected to the rail (120), the connecting slot (332) extending along the Z-axis direction, the connecting member (334) being inserted into the connecting slot (332) and being movable in the connecting slot (332) in the Z-axis direction.

3. The dispenser (100) according to claim 2, wherein:

the lifting member (310) is a clevis-like and sleeved on the rail (120) from the underside of the rail (120), the lifting member (310) comprising a pair of side plates (312) and a base plate (314) connected between the pair of side plates (312), the pair of side plates (312) being respectively located on opposite sides of the rail (120), the base plate (314) being located below the rail (120), wherein the pair of side plates (312) each has at least one connecting slot (332).

4. The dispenser (100) according to claim 3, wherein:

the lifting member (310) extends by a distance along the X-axis direction; and the lifting device (250) comprises several reset members (320), several connecting slots (332) disposed on each of the side plates (312), and several connecting members (334) corresponding to the several connecting slots (332), wherein the several reset members (320) are arranged in the X-axis direction, and the several connecting slots (332) are arranged in the X-axis direction.

5. The dispenser (100) according to claim 4, wherein:

a hole (340) is provided in the rail (120), and the reset member (320) is at least partially located in the hole (340).

6. The dispenser (100) according to claim 3, wherein:

the lifting device (250) further comprises a guide wheel (335) having a slit (338) on an exterior surface thereof, the slit (338) extending circumferentially along the guide wheel (335);

wherein the guide wheel (335) is sleeved on the connecting member (334), the guide wheel (335) is inserted into the connecting slot (332), and opposite edges (337) of the side plate (312) of the lifting member (310) forming the connecting slot (332) are clamped in the slit (338) of the guide wheel (335).

7. The dispenser (100) according to claim 1, wherein:

the reset member (320) is a helical spring.

8. The dispenser (100) according to claim 7, wherein:

the dispenser (100) also comprises a guide pin (325), a bottom end (326) of the guide pin (325) is connected to the lifting member (310), and the reset member (320) is sleeved on the guide pin (325).

9. The dispenser (100) according to claim 1, wherein:

the blocking portion (220) is formed by a baffle mounted at a top end of the rail (120).

10. The dispenser (100) according to claim 1, further comprising:

a drive device (203) disposed below the heating device (201) for driving movement of the heating device (201) in the Z-axis direction.

* * * * *